United States Patent
Uchiyama et al.

[19]

[11] Patent Number: 6,160,623

[45] Date of Patent: Dec. 12, 2000

[54] METHOD FOR MEASURING AN ABERRATION OF A PROJECTION OPTICAL SYSTEM

[75] Inventors: Takayuki Uchiyama; Seiji Matsuura, both of Tokyo, Japan

[73] Assignee: NEC Corporation, Tokyo, Japan

[21] Appl. No.: 09/490,475

[22] Filed: Jan. 24, 2000

[30]    Foreign Application Priority Data

Jan. 26, 1999 [JP] Japan .................................. 11-016856
Jul. 15, 1999 [JP] Japan .................................. 11-201982

[51] Int. Cl.$^7$ ................................................... G01B 11/00
[52] U.S. Cl. .......................... 356/401; 356/399; 250/548
[58] Field of Search .................... 356/399–401; 250/548

[56]         References Cited

U.S. PATENT DOCUMENTS 5,208,629   5/1993   Matsuo et al. ........................... 356/401

FOREIGN PATENT DOCUMENTS 10-232185   9/1998   Japan .

*Primary Examiner*—Robert H. Kim
*Attorney, Agent, or Firm*—Scully, Scott, Murphy & Presser

[57]          ABSTRACT

An aberration of a projection exposing apparatus system is measured from the difference between widths of both-end lines even in a fine pattern having a pattern line width of less than 0.2 $\mu$m. A resist film on a substrate is exposed to light, using a mask having a line-and-space (LS) pattern. This exposure is repeated plural times at plural exposures, so as to obtain, at the respective exposures, the differences between the widths of the both-end lines of the line-and-space pattern. The difference between the widths of the both-end lines at a standard (optimal) exposure is estimated from the relationship between the differences between the widths of the both-end lines and the exposures, so as to obtain an aberration at the standard exposure.

13 Claims, 6 Drawing Sheets

LS PATTERN

EXPOSURE NORMALIZED BY THE OPTIMAL EXPOSURE FOR L3
(KrF EXPOSURE, NA=0.60, ANNULAR ILLUMINATION, 0.15 μm WIDTH LS, THE LEFT END OF AN EXPOSURE FIELD)

EXPOSURE NORMALIZED BY THE OPTIMAL EXPOSURE FOR L3
(KrF EXPOSURE, NA=0.60, ANNULAR ILLUMINATION, 0.15 μm WIDTH LS, THE RIGHT END OF AN EXPOSURE FIELD)

EXPOSURE NORMALIZED BY THE OPTIMAL
EXPOSURE FOR L3
(KrF EXPOSURE, NA=0.60, ANNULAR
ILLUMINATION, 0.15 $\mu$m WIDTH LS, THE CENTER
OF AN EXPOSURE FIELD)

METHOD FOR MEASURING AN ABERRATION OF A PROJECTION OPTICAL SYSTEM

BACKGROUND OF THE INVENTION

1. Field of the Invention

The present invention relates to a method for measuring an aberration of a projection optical system of a projection exposing apparatus for resolving a circuit pattern of a semiconductor device or the like, and in particular to a method making it possible to measure an aberration of a projection optical system even if light from an subject pattern does not form an image by a standard exposure because the pattern is too fine.

2. Description of the Related Art

FIG. 1 is a schematic view illustrating a conventional projection exposing apparatus. An excimer laser beam emitted from an excimer laser source 1 is reflected on a mirror 2 to advance into a fly eye lens 4 through a shutter 3 for controlling an exposure. The beam whose illumination intensity has been made uniform through this fly eye lens 4 is restricted with a variable opening iris 5, and then passes through a lens system 6. The beam is reflected on a mirror 7 and is applied through a condenser lens 8 to a mask 9. The beam which has passed through the mask 9 focuses, through a projection lens 10, onto a wafer 11 on a stage 12.

As shown in FIG. 2, in this case a resist film on the wafer 11 is exposed to the beam, using a mask wherein a line-and-space pattern (referred to as an LS pattern hereinafter) is formed. The LS pattern is composed of plural lines (for example, L1–L5) which have the same width and are arranged in parallel and at even intervals. The exposed resist film is developed. About the LS pattern resulting from the development of this resist film, the widths of the respective lines thereof are measured. An aberration (i.e., aberration amount) of a coma can be obtained from the difference between the widths of the lines at both ends of this LS pattern (Japanese Patent Application Laid-Open No. 10-232185).

Conventionally, the difference between the widths of the both-end lines can be measured in an LS pattern having a line width of, for example, 0.25 μm by exposure using, as a light source, a KrF excimer laser having a wavelength of 248 nm. However, the difference between the widths of the both-end lines cannot be measured in an LS pattern having a smaller line width, for example, a line width of 0.15 μm.

In recent years, it has been demanded that a finer pattern be formed for a wavelength used in a projection exposing apparatus. For example, it is demanded that a pattern having a width of about 0.15 μm be formed by exposure to a KrF excimer laser beam having a wavelength of 248 nm. In order to enlarge focal depth, therefore, it is necessary to use a super-resolution method such as annular illumination. However, if the difference between the widths of the both-end lines in an LS pattern having a width of 0.15 μm is actually attempted to be obtained by the annular illumination, the both-end lines L1 and L5 may become highly thin to fall down by light approaching effect according to exposure using an optimal exposure, wherein the centerline L3 in the LS pattern is resolved to a line width as designed.

According to normal illumination under the illumination condition that the use of a phase shift mask is optimal: σ=0.3, an LS pattern having a width of 0.15 μm is not resolved by an optimal exposure of the LS pattern. In other words, if the centerline of the LS pattern is exposed to light using the optimal exposure, the both-end lines in the LS pattern are not resolved.

Hitherto, therefore, it has been unable to obtain a coma by the difference between widths of the both-end lines in the case of a pattern having a fine pattern line width such as 0.15 μm.

Incidentally, the difference between widths of right and left lines changes correspondingly to exposures. Thus, it is necessary that the exposure as a standard be beforehand decided. Since the optimal exposure for the centerline of any LS pattern is not easily affected by aberration, the optical exposure for the centerline of any LS pattern is usually used as the exposure that is the standard.

SUMMARY OF THE INVENTION

An object of the present invention is to provide a method making it possible to measure an aberration of a projection exposing apparatus system from the difference between widths of both-end lines even in a fine pattern having a pattern line width of less than 0.2 μm.

A first aspect of the present invention is a method for measuring an aberration of a projection optical system, comprising the steps of:

exposing a resist film on a substrate, using a mask having a line-and-space pattern;

repeating this exposure step plural times at plural exposures, so as to obtain, at the respective exposures, the differences between the widths of the both-end lines of the line-and-space pattern; and estimating the difference between the widths of the both-end lines at a standard exposure, from the relationship between the differences between the widths of the both-end lines and the exposures, so as to obtain an aberration at the standard exposure.

A second aspect of the present invention is a method for measuring an aberration of a projection optical system, comprising the steps of:

arranging a mask having a line-and-space pattern having plural lines of the same width in an optical path of a projection optical system;

exposing a substrate onto which a resist is applied to light, using the mask;

performing the exposing step plural times at plural exposures and then developing the resist after the exposures, so as to measure, at the plural exposures, the differences between the widths of lines of the both-ends in the line pith direction of the resultant resist pattern; and estimating the difference between the widths of the both-end lines at a standard exposure, from the relationship between the differences between the widths of the both-end lines and the exposures, so as to obtain an aberration at the standard exposure.

A third aspect of the present invention is a method for measuring an aberration of a projection optical system, comprising the steps of:

exposing a resist film on a substrate, using a mask having a line-and-space pattern;

repeating this exposure step plural times at plural exposures, so as to obtain, at the respective exposures, the differences between the widths of the both-end lines of the line-and-space pattern;

causing the relationship between the differences between the widths of the both-end lines and the exposures to approximate a straight line, so as to estimate the difference between the widths of the both-end lines at a standard exposure, obtaining beforehand such approximation straight lines as above for plural exposure conditions, so as to obtain the relationship between absolute values of inclinations of the approximation straight lines and the estimation values of the difference between the widths of the both-end lines at the standard exposure; and obtaining an approximation line for exposure condition whose aberration is to be obtained at the standard exposure and estimating, from the inclination of the approximation lines, the difference between the widths of the both-end lines at the standard exposure on the basis of the above-mentioned relationship, so as to obtain an aberration at the standard exposure.

A fourth aspect of the present invention is a method for measuring an aberration of a projection optical system, comprising the steps of:

arranging a mask having a line-and-space pattern having plural lines having the same width in an optical path of a projection optical system;

exposing a substrate onto which a resist is applied to light, using the mask;

performing the exposing step plural times at plural exposures and then developing the resist after the exposures, so as to measure, at the plural exposures, the differences between the widths of lines of the both-ends in the line pith direction of the resultant resist pattern;

causing the relationship between the differences between the widths of the both-end lines and the exposures to approximate a straight line, so as to estimate the difference between the widths of the both-end lines at a standard exposure, obtaining beforehand such approximation straight lines as above for plural exposure conditions, so as to obtain the relationship between absolute values of inclinations of the approximation straight lines and the estimation values of the difference between the widths of the both-end lines at the standard exposure; and obtaining an approximation line for exposure condition whose aberration is to be obtained at the standard exposure and estimating, from the inclination of the approximation lines, the difference between the widths of the both-end lines at the standard exposure on the basis of the above-mentioned relationship, so as to obtain an aberration at the standard exposure.

The inventor has made various researches to obtain the difference between the widths of the both-end lines at the standard exposure in a pattern which has lines having such a very small width that its aberration cannot be measured according to the prior art, for example, less than 0.2 $\mu$m (especially 0.15 $\mu$m). As a result, it has found that when an LS pattern is exposed to light for a resist film on a substrate at plural exposures and the resist is developed to obtain an aberration from the difference between the widths of the both-end lines of the resolved pattern, this aberration has a correlation with the exposure. Thus, if the curve showing this correlation is extrapolated to the optimal exposure for the center line of the LS pattern, the difference between the widths of the both-end lines can be obtained at this optimal exposure even in the case that the LS pattern is not resolved at this optimal exposure. The aberration of the projection optical system can be obtained from this difference between the widths of the both-end lines.

Moreover, it has been found that when the correlation between exposure and the difference between the widths of the both-end lines is caused to approximate a straight line and the absolute value of the inclination thereof is obtained, the absolute value of the inclination thereof and the estimation value of the difference between the widths of the both-end lines at the standard exposure has a correlation. Thus, such approximation lines as above are obtained for plural exposure fields, and the relationship between the absolute values of the inclinations of the plural approximation straight lines and estimation values of the difference between the widths of the both-end lines at the standard exposure (this relationship may be referred to as the relationship between the inclination and the both end line width difference hereinafter) is beforehand obtained. In this way, the approximation lines are obtained for the exposure fields whose aberrations are to be obtained at the standard exposure. From the inclinations thereof the difference between the widths of the both-end lines at the standard exposure can be obtained on the basis of this relationship between the inclination and the both end line width difference. Since the difference between the widths of the both-end lines used to obtain this relationship between the inclination and the both end line width difference is an estimation value of the difference between the widths of the both-end lines at the standard exposure, the resultant difference between the widths of the both-end lines become more accurate.

DESCRIPTION OF PREFERRED EMBODIMENTS

Referring to the attached drawings, embodiments of the present invention will be specifically described hereinafter.

Figure 3:
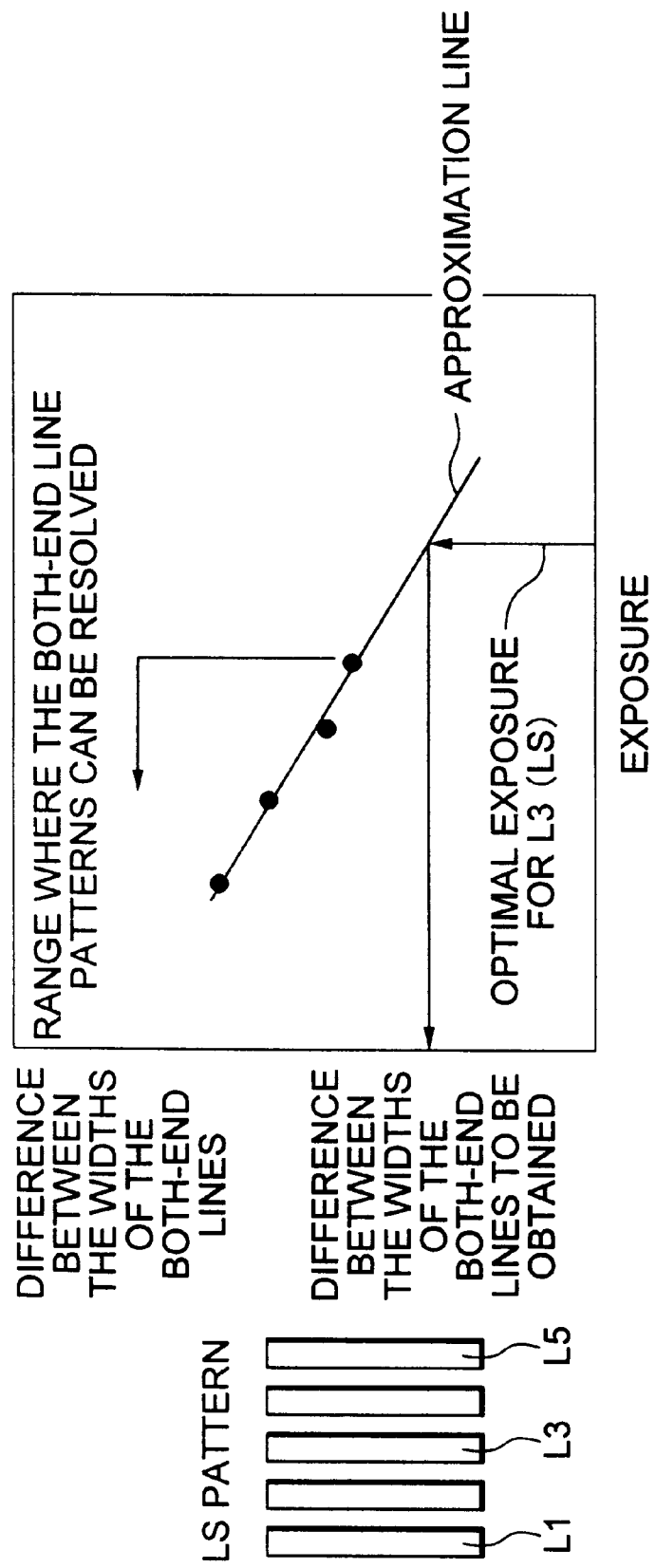
FIG. 3 is a view for explaining the principle of the present invention.

A first embodiment of the present invention will be described, referring to FIGS. 3–6. FIG. 3 is a view for explaining the principle of the present invention, and is a graph showing the relationship between exposure, expressed by the horizontal axis of this graph, and difference between widths of both-end lines, expressed by the vertical axis thereof. As shown in FIG. 3, the optimal exposure (standard exposure) for a centerline L3 of an LS pattern is within the range that the both-end lines of the LS pattern are not resolved. However, the relationship between the exposure and the difference between the widths of the both end lines has a correlation similar to linearity. Thus, when this correlation is used as an approximation line and this approximation line is extrapolated up to the optimal exposure for the line L3, which is present in the range where the both-end patterns are not resolved, the difference between the widths of the both-end lines can be obtained at the optimal exposure. FIG. 3 is concerned with a case that the used resist film is a positive type and is exposed to light as a positive pattern. In this case, the both-end lines are not resolved by a high exposure. However, the both-end lines are resolved if the exposure is lowered. On the other hand, in the case that a negative resist film is used and exposed to light as a negative pattern, the inclination of the resultant approximation line is opposite to that of the approximation line shown in FIG. 3. If the exposure is increased, the difference between the widths of the both-end lines is made large.

Since the difference between the widths of the both-end lines in any LS pattern is generated by a coma, the difference is used for the quantitative measurement of the coma. The difference between the widths of the both-end lines changes by the pitch of a pattern, an illumination condition, the position of the pattern inside an exposure field, and the like. If the both-end lines are not resolved, the difference between the widths of the both-end lines of the LS pattern and coma cannot be obtained. However, in the case that the lines of the LS pattern are fine or fall down or in the case that the LS pattern is not separated, it is possible to estimate the difference between the widths of the both-end lines at the optimal exposure for the LS pattern from the following approximation line: in the former case, the approximation line showing the dependency of the difference between the widths of the both-end lines at the side of under-exposure upon exposures; and in the latter case, the approximation line showing the dependency of the difference between the widths of the both-end lines at the side of over-exposure upon exposures.

The approximation line shown in FIG. 3 is a straight line, but the resultant correlation does not necessarily have linearity. However, the correlation between the exposure and the difference between the widths of the both-end lines has sufficient linearity in the range near the range where the both-end lines can be resolved. Accordingly, even when a subject pattern is very fine and thus the pattern is not resolved on a resist film by a standard exposure so that a resist pattern is not formed, the difference between the widths of the both-end lines is measured at plural exposures in such a manner that the exposures are changed in the range where a resist pattern is formed. In this way, it becomes possible to estimate the difference between the widths of the both-end lines at the standard exposure from the correlation between the exposure and the difference between the widths of the both-end lines and obtain the aberration at the standard exposure.

Figure 1:
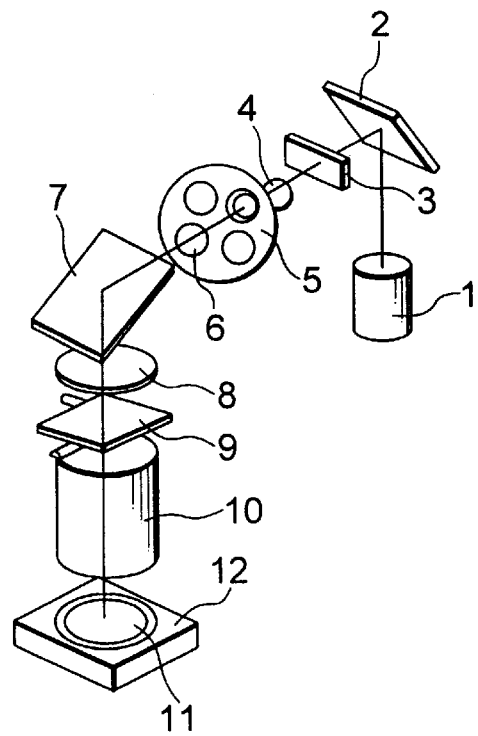
FIG. 1 is a schematic view showing a conventional projection exposing apparatus.
Figure 2:
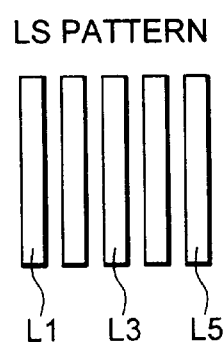
FIG. 2 is a view showing a line-and-space pattern.
Figure 4:
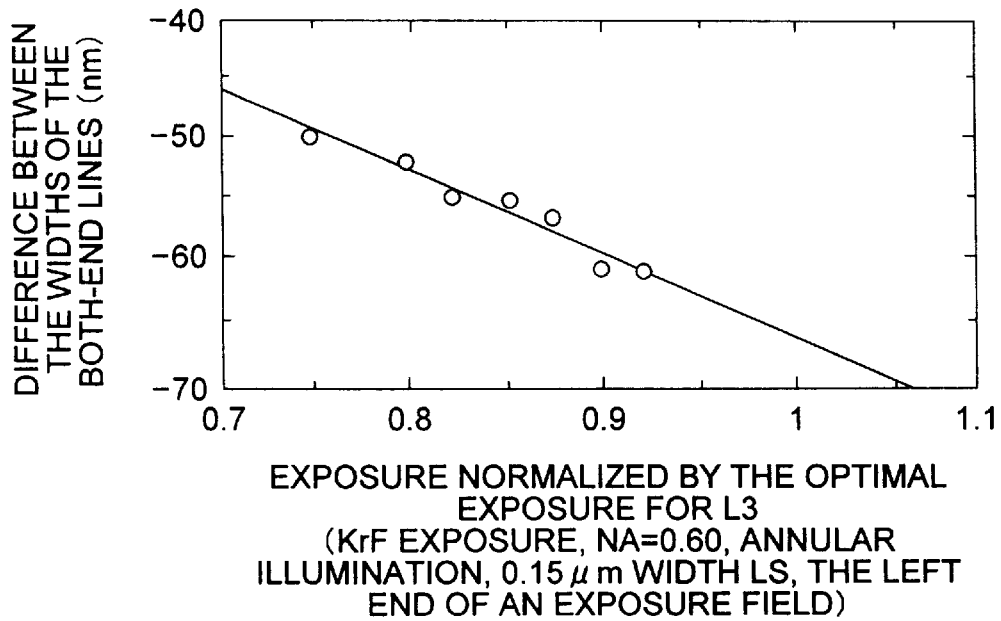
FIG. 4 is a graph showing the relationship between the optimal exposure at the left end of an exposure field and the difference between the widths of the both-end lines.
Figure 5:
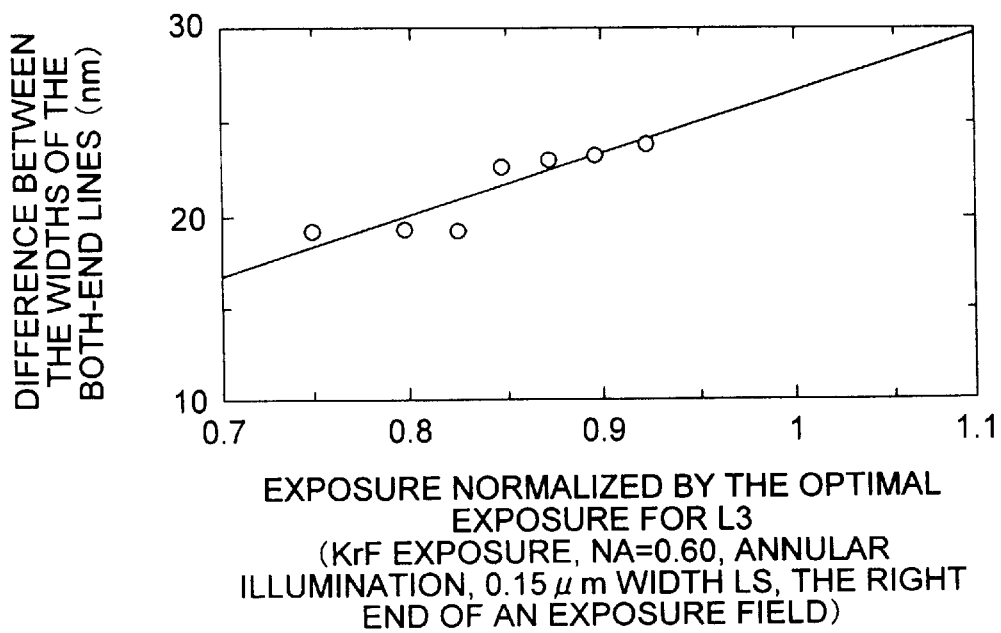
FIG. 5 is a graph showing the relationship between the optimal exposure at the right end of the exposure field and the difference between the widths of the both-end lines.
Figure 6:
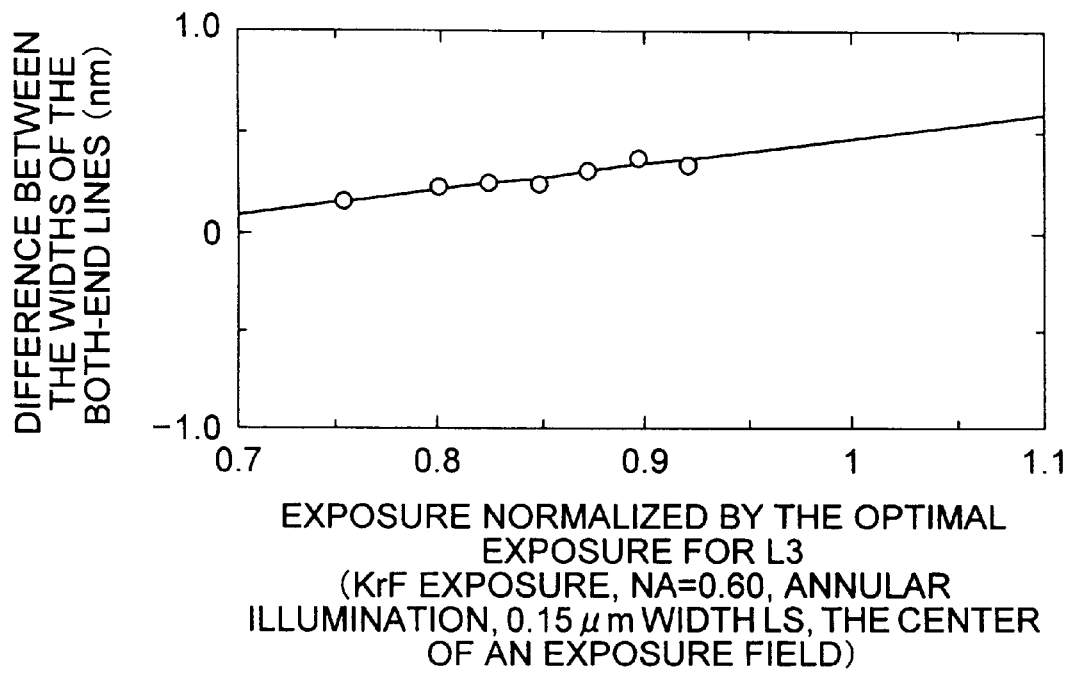
FIG. 6 is a graph showing the relationship between the optimal exposure at the center of the exposure field and the difference between the widths of the both-end lines.

In a projection exposing apparatus, an area (8 mm×25 mm) was exposed to one shot of light. FIG. 2 shows the difference between the widths of the both-end lines, measured at the left end in the longitudinal direction of the one-shot area, in this case. FIG. 5 shows the difference between the widths of the both-end lines, measured at the right end thereof, in this case. FIG. 6 shows the difference between the widths of the both-end lines, measured at the center thereof, in this case. FIGS. 4–6 are concerned with a case that exposure was performed by annular illumination, using a KrF excimer laser as a light source and a mask having a nominal aperture of NA=0.60 and having an LS pattern whose line width is 0.15 $\mu$m. FIGS. 4–6, their horizontal axes express exposure normalized by the optimal exposure for the centerline L3 of the LS pattern.

As shown in FIGS. 4–6, the difference between the widths of the both-end lines are measured in the range where the normalized exposure is from 0.75 to 0.93. As shown in FIG. 4, the difference between the widths of the both-end lines becomes smaller at the left end of the exposure field when the exposure becomes larger. On the other hand, as shown in FIG. 5 the difference between the widths of the both-end lines becomes larger at the right end of the exposure field when the exposure becomes larger. As shown in FIG. 6, at the center of the exposure field a change in the difference between the widths of the both-end lines is little against a change in the exposure. However, when the exposure increases, the difference between the widths of the both-end lines slightly increases.

In all of the cases, the relationship between the exposure and the difference between the widths of the both-end lines has a linear correlation. At the optimal exposure for the line L3, that is, at the point where the exposure normalized in FIGS. 4–6 is 1, the difference between the widths of the both-end lines was not obtained. Thus, if an approximation line is obtained from the measured points in FIGS. 4–6 and then this approximation line is extrapolated up to the point where the normalized exposure is 1 to obtain the difference between the widths of the both-end lines at the point where the normalized exposure is 1, it is possible to obtain comas in respective positions of the exposure field at the optimal exposure for the line L3.

Figure 7:
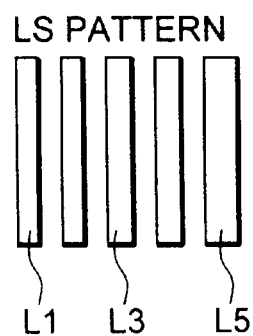
FIG. 7 is a schematic view showing an affect on line width of an LS pattern by a coma.

The following will describe a second embodiment of the present invention. The affect of a coma, which is a main factor of a scattering in dimension within the exposure field, includes the above-mentioned transcription in the state that the widths of the both-end lines of an LS pattern are different. FIG. 7 is a schematic view showing the affect of coma on an LS pattern (for example, L1–L5). As shown in FIG. 7, the difference between widths of the both-end lines of the LS pattern transcribed in the state that the line widths are different by the coma has a correlation with exposure, as stated about the first embodiment. The correlation has a sufficient linearity in the range near the range where the both-end lines (L1 and L5 in the case shown in FIG. 7) are resolved.

In the first embodiment, the optimal exposure for the centerline in the LS pattern is used as a standard exposure, and the difference between the widths of the both-end lines, at the standard exposure, is used as an index. In this condition, from the dependency of exposure upon the difference between the widths of the both-end lines, the coma at the standard exposure is obtained. By this, a scattering in the dimension is overcome. In the present embodiment, there is used the inclination of the approximation line showing the relationship between the difference between the widths of the both-end lines and the exposure used in the first embodiment. In this way, the difference between the widths of the both-end lines is indirectly obtained.

Figure 8:
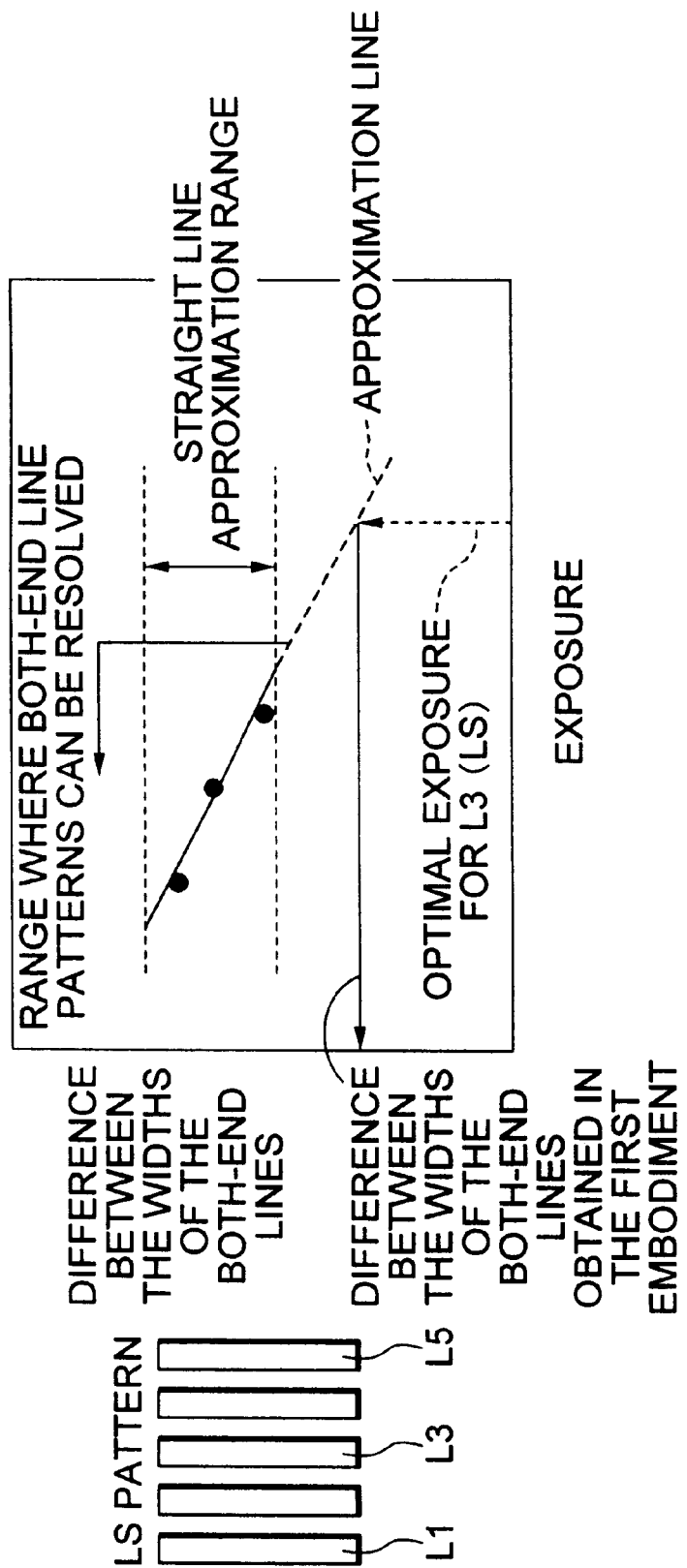
FIG. 8 is a graph showing the relationship between exposure and the difference between the widths of the both-end lines.

In the first manner as in the first embodiment, a standard exposure is made to the optimal exposure for the centerline (L3) of an LS pattern and the difference between the widths of the both-end lines is obtained correspondingly to this optimal exposure. For this, the both-end lines of the LS pattern are exposed to light at such plural exposures that the both-end lines will have a substantial target dimension, that is, the same dimension as the line width of the mask, so as to measure the difference between the widths of the both-end lines. FIG. 8 is a graph showing the relationship between exposure and the difference between the widths of both-end lines. Its horizontal axis expresses the exposure, and the vertical axis expresses the difference between the widths of the both-end lines of an LS pattern. As shown in FIG. 8, the relationship of the dependency of the exposure upon the difference between the widths of the both-end lines is caused to approximate a straight line. This straight line is used to obtain the estimation value of the difference between the widths of the both-end lines at the optimal exposure.

The dependency upon the exposure can substantially approximate a straight line near the target dimension of the both-lines of the pattern, that is, the line width of the mask. Accordingly, as a method for obtaining an approximation line, there is, for example, a method of obtaining the average of the line widths of the both-end lines L1 and L5 resolved at a specific exposure, extracting such data that this average falls within ±10% of the target dimension of line width, plotting the relationship between exposure and the difference between the widths of the both-end lines about these data, and approximating the resultant to a straight line.

For example, a mask having a line width of 200 nm, which is a target dimension, is used to change an exposure fron "a" to "g". The average of the widths of the lines L1 and L5 of the thus obtained LS pattern is obtained. It is assumed that in the case the following are obtained:

Exposure "a": L1=236 nm, L5=214 nm, the average=225 nm,
Exposure "b": L1=226 nm, L5=208 nm, the average=217 nm,
Exposure "c": L1=216 nm, L5=200 nm, the average=208 nm,
Exposure "d": L1=208 nm, L5=194 nm, the average=200 nm,
Exposure "e": L1=200 nm, L5=184 nm, the average=196 nm,
Exposure "f": L1=192 nm, L5=178 nm, the average=185 nm, and
Exposure "g": L1=184 nm, L5=172 nm, the average=178 nm.

The exposures that the average of L1 and L5 obtained in this case falls within ±10% of the target dimension, that is, the exposures that the average falls within the range of 180 to 220 nm correspond to the exposures "b"–"f". Therefore, data on the exposures "b"–"f" are plotted on a graph. The relationship between the difference between the widths of the both-end lines and the exposures which fall within this range is caused to approximate a straight line. In this way, an approximation line is obtained and its inclination is also obtained.

Generally, in the case that the line widths L1–L5 are wide, dependency on exposure is strong, and in the case that the line widths L1–L5 are narrow, dependency on exposure is weak. Therefore, in the case that the dependency of the difference between the widths of the both-end lines upon exposure is caused to approximate a straight line, accidental errors become large if an approximation line is obtained using all measured values in the range where the both-end lines L1 and L5 are resolved. The range of the exposure for obtaining the approximation line is preferably set in such a manner that the resultant widths of the both-end lines are near the target dimension.

In the relationship shown in FIG. 8, the both-end lines of the LS pattern are not resolved by the optimal exposure for the centerline (L3) of the LS pattern. Such a problem frequently arises mainly in the case of using an illumination system such as annular illumination.

Figure 9:
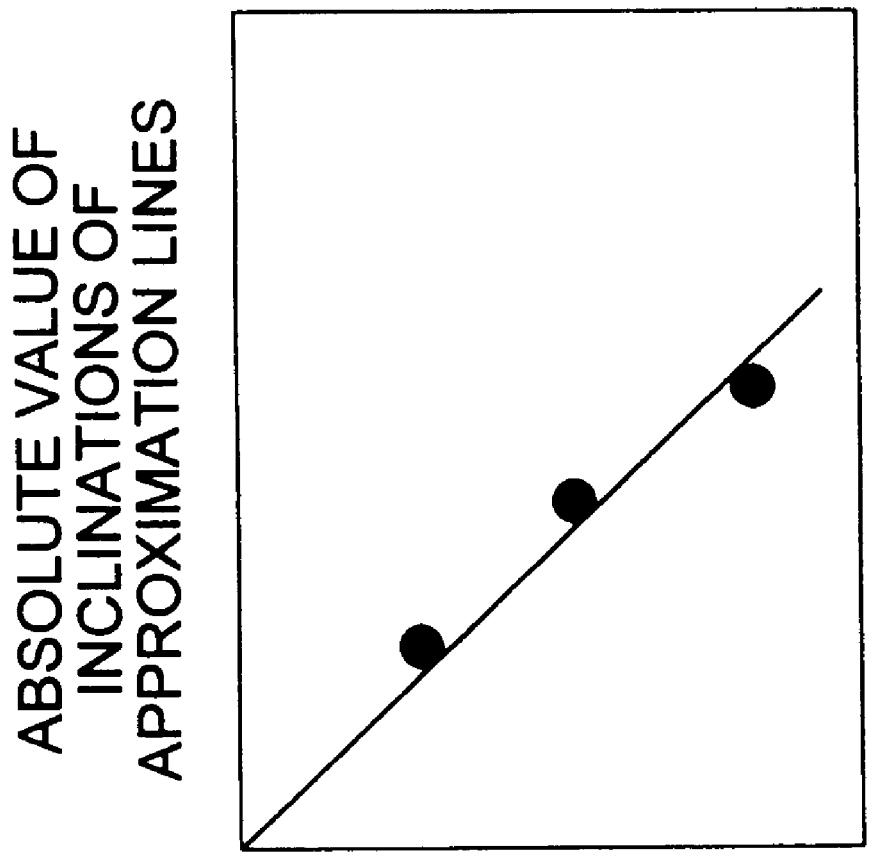
FIG. 9 is a graph showing the relationship between absolute values of the inclinations of approximation straight lines and estimation values of the differences between the widths of the both-end lines.

Next, the relationships shown in FIG. 8 are obtained about plural exposure fields. Each of the inclinations of the approximation lines showing the dependency of exposure is obtained. There is a proportional relationship between the absolute values of the inclinations of these approximation lines and the estimation values of the difference between the widths of the both-end lines at the optimal exposure, which are estimated from the approximation lines. FIG. 9 is a graph showing the relationship between the absolute values of inclinations of approximation lines and the estimation values of the difference between the widths of the both-end lines at the optimal exposure. As shown in FIG. 9, there is a proportional relationship between: the absolute values of the inclinations of the approximation lines showing the dependency upon exposure in the plural exposure fields; and the difference between the widths of the both-end lines at the optimal exposure, corresponding to it.

Therefore, approximation straight lines as shown in FIG. 8 are obtained for the plural exposure fields and then the relationship between the absolute values of the inclinations of the plural approximation straight lines and estimation values of the difference between the widths of the both-end lines at the standard exposure (that is, the relationship between the inclination and the both end line width difference hereinafter) is beforehand obtained. In this way, the approximation lines are obtained for the exposure fields whose aberrations are to be obtained at the standard exposure. If their inclinations are applied to the above-mentioned and beforehand-obtained relationship between the inclination and the both end line width difference, the difference between the widths of the both-end lines at the standard exposure can be obtained. Accordingly, aberrations at the optimal exposure can be obtained from the difference between the widths of the both-end lines.

In the present embodiment, the approximation straight lines are obtained from the plural exposure-dependencies by changing the exposure fields and measuring the difference between the widths of the both-end lines. By changing subject dimension, illumination conditions ($\sigma$) or the used resist, as well as the exposure fields, the inclinations of the approximations straight lines, which are obtained from the relationship between the difference between the widths of the both-end lines and exposure, become also different.

For example, as the subject dimension is finer, the inclination thereof is larger. This is the following reason. As the subject dimension is finer, an influence is easily produced by lens aberration. As mask dimension becomes smaller so that the value of (L1+L5) becomes smaller, the value of the abnormal line width value defined as (L1−L5)/(L1+L5) changes more sensitively.

In the case that illumination is small $\sigma$ illumination or annular illumination, the inclination of the approximation straight line trends to be large. This is because an influence is easily produced by lens aberration under such illumination conditions. In the small $\sigma$ illumination and the annular illumination, the line whose width is thicker among the right and left lines L1 and L5 becomes reverse. In the small $\sigma$ illumination and the annular illumination, therefore, the signs of the abnormal line width value become reverse and further the inclinations of the approximation straight line become reverse.

As the resolution of the resist is poorer, the abnormal line width value and the inclination thereof become larger. In the resist having a sufficiently high resolution, the calculated value of light intensity is reflected as it is on the above-mentioned parameters. However, in the resist having a poor resolution, the fact that the line width grows fat or becomes thin is more emphasized. Thus, the dependency of the particular pattern upon exposure is bad so that the inclination of the abnormal line width values becomes large.

Plural approximation straight lines are obtained by changing such conditions as the subject dimension, the illumination conditions (σ) or the resist, and then the relationship between the inclination and the both end line width difference is beforehand obtained. Even if the inclinations of the approximation straight lines obtained from the relationship between the difference between the widths of the both-end lines and exposure are different by changing these conditions, they are applied to the beforehand-obtained relationship between the inclination and the both end line width difference so that the difference between the widths of the both-end lines can be obtained at the standard exposure. From this difference between the widths of the both-end lines, the aberration at the standard exposure can be obtained.

In this way, the difference between the widths of the both-end lines and the coma at the optimal exposure can be indirectly obtained from the relationship between the inclination and the both end line width difference. By obtaining the coma indirectly in this way, it is possible to reduce the scattering in the dimension of the LS pattern and obtain the coma accurately.

When small σ illumination is used, there arises a problem that the both-end lines are separated from lines adjacent thereto. If in this case a graph showing dependency upon exposure is caused to approximate a straight line and the inclination thereof is obtained, the same effects as in the present embodiment can be obtained.

The present embodiment is concerned with a case that the resist film is a positive type and is exposed to light as a positive pattern. Thus, the both-end lines are not resolved at a high exposure. However, the both-end lines are resolved if the exposure is lowered. On the other hand, in the case that a negative resist is used and exposed to light as a negative pattern, the inclination of such an approximation straight line as shown in FIG. 8 becomes reverse and the difference between the widths of the both-end lines becomes large. In this case, the relationship between the inclination and the both end line width difference is a proportional relationship. From this proportional relationship, the difference between the widths of the both-end lines and the aberration can be indirectly obtained.

As described above, according to the present invention, the difference between the widths of the both-end lines at the standard exposure optimal for the center line of an LS pattern can be obtained even in the case that the pattern has lines having such a very small width that its aberration cannot be measured according to the prior art, for example, less than 0.2 μm (especially 0.15 μm). Thus, aberration can be obtained.

What is claimed is:

1. A method for measuring an aberration of a projection optical system, comprising the steps of:

exposing a resist film on a substrate, using a mask having a line-and-space pattern;

repeating this exposure step plural times at plural exposures, so as to obtain, at the respective exposures, the differences between the widths of the both-end lines of the line-and-space pattern; and estimating the difference between the widths of the both-end lines at a standard exposure, from the relationship between the differences between the widths of the both-end lines and the exposures, so as to obtain an aberration at the standard exposure.

2. A method for measuring an aberration of a projection optical system, comprising the steps of:

arranging a mask having a line-and-space pattern having plural lines having the same width in an optical path of a projection optical system;

exposing a substrate onto which a resist is applied to light, using the mask;

performing the exposing step plural times at plural exposures and then developing the resist after the exposures, so as to measure, at the plural exposures, the differences between the widths of lines of the both-ends in the line pith direction of the resultant resist pattern; and estimating the difference between the widths of the both-end lines at a standard exposure, from the relationship between the differences between the widths of the both-end lines and the exposures, so as to obtain an aberration at the standard exposure.

3. A method for measuring an aberration of a projection optical system according to claim 1, wherein the relationship between the differences between the widths of the both-end lines and the exposures has linearity.

4. A method for measuring an aberration of a projection optical system according to claim 2, wherein the relationship between the differences between the widths of the both-end lines and the exposures has linearity.

5. A method for measuring an aberration of a projection optical system, comprising the steps of:

exposing a resist film on a substrate, using a mask having a line-and-space pattern;

repeating this exposure step plural times at plural exposures, so as to obtain, at the respective exposures, the differences between the widths of the both-end lines of the line-and-space pattern;

causing the relationship between the differences between the widths of the both-end lines and the exposures to approximate a straight line, so as to estimate the difference between the widths of the both-end lines at a standard exposure, obtaining beforehand such approximation straight lines as above for plural exposure conditions, so as to obtain the relationship between absolute values of inclinations of the approximation straight lines and the estimation values of the difference between the widths of the both-end lines at the standard exposure; and obtaining an approximation line for exposure condition whose aberration is to be obtained at the standard exposure and estimating, from the inclination of the approximation lines, the difference between the widths of the both-end lines at the standard exposure on the basis of the above-mentioned relationship, so as to obtain an aberration at the standard exposure.

6. A method for measuring an aberration of a projection optical system, comprising the steps of:

arranging a mask having a line-and-space pattern having plural lines having the same width in an optical path of a projection optical system;

exposing a substrate onto which a resist is applied to light, using the mask;

performing the exposing step plural times at plural exposures and then developing the resist after the exposures, so as to measure, at the plural exposures, the differences between the widths of lines of the both-ends in the line pith direction of the resultant resist pattern;

causing the relationship between the differences between the widths of the both-end lines and the exposures to approximate a straight line, so as to estimate the difference between the widths of the both-end lines at a standard exposure, obtaining beforehand such approximation straight lines as above for plural exposure conditions, so as to obtain the relationship between absolute values of inclinations of the approximation straight lines and the estimation values of the difference between the widths of the both-end lines at the standard exposure; and obtaining an approximation line for exposure condition whose aberration is to be obtained at the standard exposure and estimating, from the inclination of the approximation lines, the difference between the widths of the both-end lines at the standard exposure on the basis of the above-mentioned relationship, so as to obtain an aberration at the standard exposure.

7. A method for measuring an aberration of a projection optical system according to claim 5, wherein the relationship between the absolute values of the inclinations of the approximate straight lines and the estimation values of the difference between the widths of the both-end lines at the standard exposure is proportional.

8. A method for measuring an aberration of a projection optical system according to claim 6, wherein the relationship between the absolute values of the inclinations of the approximate straight lines and the estimation values of the difference between the widths of the both-end lines at the standard exposure is proportional.

9. A method for measuring an aberration of a projection optical system according to claim 5, wherein the exposure conditions are exposure fields.

10. A method for measuring an aberration of a projection optical system according to claim 6, wherein the exposure conditions are exposure fields.

11. A method for measuring an aberration of a projection optical system according to claim 7, wherein the exposure conditions are exposure fields.

12. A method for measuring an aberration of a projection optical system according to claim 8, wherein the exposure conditions are exposure fields.

13. A method for measuring an aberration of a projection optical system according to claim 1, wherein the width of the lines of the resist pattern is less than 0.2 $\mu$m.

* * * * *